United States Patent
Sakano et al.

(10) Patent No.: US 12,456,911 B2
(45) Date of Patent: Oct. 28, 2025

(54) DRIVING DEVICE AND SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Tatsunori Sakano, Tokyo (JP); Tomoko Matsudai, Tokyo (JP); Ryohei Gejo, Kawasaki Kanagawa (JP)

(73) Assignees: Kabushiki Kaisha Toshiba, Tokyo (JP); Toshiba Electronic Devices & Storage Corporaton, Tokyo (JP)

( * ) Notice: Subject to any disclaimer, the term of this patent is extended or adjusted under 35 U.S.C. 154(b) by 22 days.

(21) Appl. No.: 18/588,773

(22) Filed: Feb. 27, 2024

(65) Prior Publication Data
US 2025/0080105 A1    Mar. 6, 2025

(30) Foreign Application Priority Data
Sep. 1, 2023   (JP) .................... 2023-142368

(51) Int. Cl.
*H02M 1/08* (2006.01)
*H02M 1/00* (2006.01)
(Continued)

(52) U.S. Cl.
CPC .......... *H02M 1/0054* (2021.05); *H02M 1/08* (2013.01); *H03K 17/168* (2013.01); *H10D 12/481* (2025.01); *H02M 7/5387* (2013.01)

(58) Field of Classification Search
CPC .... H02M 1/0054; H02M 1/08; H02M 7/5387; H03K 17/168; H10D 12/481
(Continued)

(56) References Cited

U.S. PATENT DOCUMENTS 10,680,601 B1    6/2020   Kempitiya
2015/0303288 A1* 10/2015  Hashimoto .......... H10D 62/127
                                                363/131
(Continued)

FOREIGN PATENT DOCUMENTS

JP   2018153007 A    9/2018
JP   2019145758 A    8/2019
(Continued)

OTHER PUBLICATIONS

Koutaro Miyazaki, et al., "General purpose clocked gate driver (CGD) IC with programmable 63-level drivability to reduce IC overshoot and switching loss of various power transistors", 2016 IEEE Applied Power Electronics Conference and Exposition (APEC), 8 pages.
(Continued)

*Primary Examiner* — William Hernandez
(74) *Attorney, Agent, or Firm* — Maier & Maier, PLLC

(57) ABSTRACT

An embodiment includes a controller and a driver. The controller controls to drive a semiconductor element having a first gate electrode and a second gate electrode base on a control signal. The driver outputs a first driving signal to the first gate electrode and a second driving signal to the second gate electrode. The first driving signal drives the first gate electrode at ON or OFF timing of the control signal. The second driving signal drives the second gate electrode a timing earlier than the OFF timing of the control signal. The driver switches output impedances corresponding to the switching speed of the semiconductor element.

20 Claims, 9 Drawing Sheets

272

|    | T1 | T2 | T3 |
|----|----|----|----|
| D1 | O1 | O2 | O3 |
| D2 | O2 | O3 | O1 |
| D3 | O3 | O1 | O2 |

(51) Int. Cl.
*H03K 17/16* (2006.01)
*H10D 12/00* (2025.01)
*H02M 7/5387* (2007.01)

(58) Field of Classification Search
USPC .................................................. 327/108, 109
See application file for complete search history.

(56) References Cited

U.S. PATENT DOCUMENTS

| | | | |
|---|---|---|---|
| 2015/0318850 A1* | 11/2015 | Hiyama ................. | H02M 1/32 |
| | | | 318/400.26 |
| 2016/0118891 A1* | 4/2016 | Hashimoto .......... | H03K 17/168 |
| | | | 323/271 |
| 2017/0026034 A1* | 1/2017 | Akiyama ............... | H03K 17/28 |
| 2017/0257025 A1* | 9/2017 | Meiser ................. | H10D 30/668 |
| 2019/0198664 A1 | 6/2019 | Bina et al. | |
| 2019/0296730 A1 | 9/2019 | Ogura et al. | |
| 2020/0098903 A1* | 3/2020 | Satoh ................... | H10D 12/481 |
| 2020/0243641 A1 | 7/2020 | Nakagawa et al. | |
| 2021/0091217 A1 | 3/2021 | Miyoshi et al. | |
| 2023/0053501 A1 | 2/2023 | Fujiyoshi et al. | |
| 2023/0147438 A1 | 5/2023 | Satoh | |

FOREIGN PATENT DOCUMENTS

| | | |
|---|---|---|
| JP | 2021125921 A | 8/2021 |
| JP | 2022171392 A | 11/2022 |
| JP | 2023027528 A | 3/2023 |
| JP | 2023091047 A | 6/2023 |

OTHER PUBLICATIONS

Extended Search Report issued on Jul. 30, 2024, in corresponding European Application No. 24159719.4, 9 pages.
Sakano et al., "Three-Level Gate Drive Technique for Enhancing Switching Loss Reduction in Triple-Gate IGBTs", 34th International Symposium on Power Semiconductor Devices and ICS (ISPSD), IEEE, May 22, 2022, 4 pages.

* cited by examiner

DRIVING DEVICE AND SEMICONDUCTOR DEVICE

CROSS-REFERENCE TO RELATED APPLICATIONS

This application is based upon and claims the benefit of priority from Japanese Patent Application No. 2023-142368, filed on Sep. 1, 2023; the entire contents of which are incorporated herein by reference.

FIELD

Embodiments relate to a driving device and a semiconductor device.

BACKGROUND

As a normally off type semiconductor element for power control that is capable of handling high power, an insulated gate bipolar transistor (IGBT) is known. In such an IGBT, a conduction loss can be reduced, but a switching loss is large. There is a demand for a driving device of a semiconductor element that is capable of reducing the switching loss while maintaining a low conduction loss, and a semiconductor device on which the driving device is mounted.

DETAILED DESCRIPTION

Figure 1:
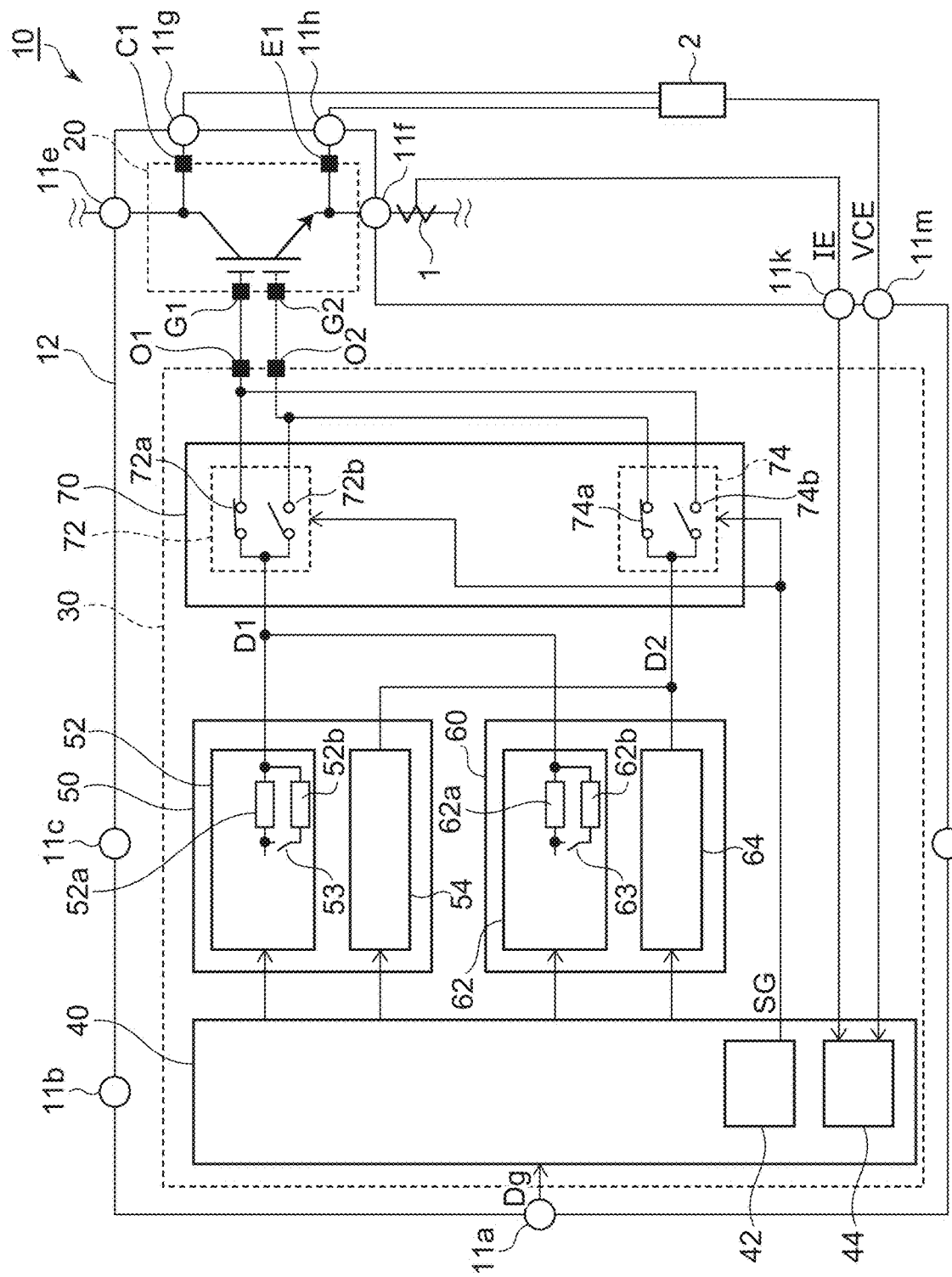
FIG. 1 is a schematic block diagram illustrating a power module according to a first embodiment.

A driving device according to an embodiment includes a controller controlling a semiconductor element including a first gate electrode and a second gate electrode, on the basis of a control signal including information relevant to an ON timing and an OFF timing of the semiconductor element, and a driver generating a first driving signal for turning on the semiconductor element through the first gate electrode at the ON timing, and turning off the semiconductor element through the first gate electrode at the OFF timing, and a second driving signal for turning off the semiconductor element by pulling out a minority carrier of the semiconductor element through the second gate electrode at a timing earlier than the OFF timing. The driver is capable of switching first output impedance when driving the first gate electrode and second output impedance when driving the first gate electrode, in accordance with a switching rate of the semiconductor element, switches to the first output impedance when the switching rate is faster than a predetermined value, and switches to the second output impedance lower than the first output impedance when the switching rate is slower than the predetermined value.

Hereinafter, embodiments will be described with reference to the drawings. In the drawings, the same reference numerals will be applied to the same parts, the detailed description thereof will be suitably omitted, and different parts will be described. Note that, the drawings are schematic or conceptual drawings, and a relationship between the thickness and the width of each part, a size ratio between the parts, or the like is not necessarily the same as that in reality. In addition, even in a case where the same part is shown, the dimensions and ratios may be different in accordance with the drawings.

First Embodiment

FIG. 1 is a schematic block diagram illustrating a power module according to a first embodiment.

As shown in FIG. 1, a power module (a semiconductor device) 10 according to the embodiment includes a switching element (a semiconductor element) 20 and a driving device 30. The power module 10 includes multiple terminals. The multiple terminals include a signal input terminal 11*a*, power source terminals 11*b* and 11*c*, a ground terminal 11*d*, a collector output terminal 11*e*, an emitter output terminal 11*f*, a collector detection terminal 11*g*, an emitter detection terminal 11*h*, a current detection terminal 11*k*, and a voltage detection terminal 11*m*. The power module 10 includes a case 12, and the switching element 20 and the driving device 30 are stored in the case 12. The multiple terminals, for example, are disposed on the case 12.

The power module 10, for example, is connected to a control device through the signal input terminal 11*a*. For example, a control signal Dg generated by the control device is input to the signal input terminal 11*a*. The control signal Dg controls the driving device 30 to drive the switching element 20. The control signal Dg, for example, is a gate signal for switching the switching element 20.

The control signal Dg, for example, is a signal having a pulse-shaped waveform, as described below in association with FIG. 2. The control signal Dg is not limited to a pulse signal insofar as an ON timing and an OFF timing of the switching element 20 can be set, and may be a digital signal or an analog signal including ON and OFF phase information.

A power source for operating the driving device 30 is connected to the power source terminals 11*b* and 11*c*. In this example, a low-voltage power source for a control unit 40 of the driving device 30 is supplied to the power source terminal 11*b*, and a high-voltage power source for a driving unit of the driving device 30 is supplied to the power source terminal 11*c*. For example, a ground potential of the power source is connected to the ground terminal 11*d*.

The collector output terminal 11*e* and the emitter output terminal 11*f* are connected to a collector electrode C1 and an emitter electrode E1 of the switching element 20, respectively. The collector electrode C1 is connected to an external circuit through the collector output terminal 11e. The emitter electrode E1 is connected to the external circuit through the emitter output terminal 11f. The external circuit, for example, is a direct-current power source line, other switching elements, or the like configuring a power conversion circuit. The collector detection terminal 11g and the emitter detection terminal 11h are connected to the collector electrode C1 and the emitter electrode E1, respectively. The collector detection terminal 11g detects and outputs the voltage of the collector electrode C1. The emitter detection terminal 11h detects and outputs the voltage of the emitter electrode E1.

In this example, the voltage of the collector electrode C1 and the voltage of the emitter electrode E1 detected in the collector detection terminal 11g and the emitter detection terminal 11h, respectively, are input to a voltage detector 2. The voltage detector 2 detects and outputs a voltage difference VCE between the voltage of the collector electrode C1 and the voltage of the emitter electrode E1, and outputs the voltage difference to the voltage detection terminal 11m. In addition, a current detector 1 is provided to be connected to the emitter output terminal 11f and detect a current IE flowing between the major electrodes of the switching element 20. The current detector 1 outputs the detected current value to the current detection terminal 11k.

The driving device 30 sets a condition for driving the switching element 20, on the basis of the current IE input to the current detection terminal 11k and the voltage difference VCE input to the voltage detection terminal 11m. The driving device 30 drives the switching element 20, in accordance with the set condition.

The driving device 30 includes output terminals O1 and O2. The switching element 20 includes a first gate electrode G1 and a second gate electrode G2. In the power module 10, the output terminal O1 is connected to the first gate electrode G1, and the output terminal O2 is connected to the second gate electrode G2.

The output terminal O1 outputs a first driving signal D1 or a second driving signal D2 to the first gate electrode G1.

In a case where the output terminal O1 outputs the first driving signal D1 to the first gate electrode G1, the output terminal O2 outputs the second driving signal D2 to the second gate electrode G2. In a case where output terminal O1 outputs the second driving signal D2 to the first gate electrode G1, the output terminal O2 outputs the first driving signal D1 to the second gate electrode G2.

The first driving signal D1 is transitioned to a voltage sufficiently higher than the threshold voltage of the switching element 20, in accordance with the ON timing of the control signal Dg. The voltage sufficiently higher than the threshold value of the switching element 20 is referred to as an ON voltage VON. The ON voltage VON, for example, is approximately +15 V.

The first driving signal D1 is transitioned to a voltage sufficiently lower than the threshold voltage of the switching element 20, in accordance with the OFF timing of the control signal Dg. The voltage sufficiently lower than the threshold voltage of the switching element 20 is referred to as an OFF voltage VOFF. The OFF voltage VOFF, for example, is approximately −15 V.

In a period where the switching element 20 is turned on, the driving device 30 changes output impedance and outputs the first driving signal D1 to the switching element 20. For example, the driving device 30 changes the output impedance, in accordance with at least one value of the voltage and the current output from the switching element 20.

For example, in the period where the switching element 20 is turned on, in a case where the switching rate of the switching element 20 is slower than a desired value, the driving device 30 decreases the output impedance and outputs the first driving signal D1. In a case where the switching rate of the switching element 20 is faster than the desired value, the driving device 30 increases the output impedance and outputs the first driving signal D1.

In a period where the switching element 20 is turned off, the driving device 30 changes the output impedance and outputs the first driving signal D1 to the switching element 20. For example, the driving device 30 changes the output impedance, in accordance with at least one value of the voltage and the current output from the switching element 20.

For example, in the period where the switching element 20 is turned off, in a case where the switching rate of the switching element 20 is slower than the desired value, the driving device 30 decreases the output impedance and outputs the first driving signal D1. In a case where the switching rate of the switching element 20 is faster than the desired value, the driving device 30 increases the output impedance and outputs the first driving signal D1.

As described above, in the driving device 30, the output impedance is changed to drive the switching element 20, in accordance with the switching rate of the switching element 20.

Accordingly, a switching loss is reduced, and the switching element 20 is prevented from being accelerated more than requires, and thus, it is possible to suppress the occurrence of a surge voltage, and the occurrence of conducted noise, radiated noise, or the like. Hereinafter, in the period where the switching element 20 is turned on and in the period where the switching element is turned off, changing the output impedance of the driving device 30 to drive the switching element 20 may be referred to as "active driving".

The second driving signal D2 is transitioned to the ON voltage VON, at a timing when the control signal Dg is turned on. The second driving signal D2 is transitioned to the OFF voltage VOFF, at a timing earlier than a timing when the control signal Dg is turned off. The transition of the second driving signal D2 to the ON voltage VON can also be after a predetermined delay time at the timing when the control signal Dg is turned on.

The driving device 30 outputs the first driving signal D1 to the first gate electrode G1, and outputs the second driving signal D2 to the second gate electrode G2, and thus, it is possible to promptly turn off the switching element 20. The driving device 30 outputs the first driving signal D1 to the second gate electrode G2, and outputs the second driving signal D2 to the first gate electrode G1, and thus, it is possible to promptly turn off the switching element 20. As described above, before the period where the switching element 20 is turned off, driving the switching element 20 by using the second driving signal D2 transitioned to the OFF voltage VOFF may be referred to as "double gate driving".

The output terminals O1 and O2, for example, periodically switch and output the first driving signal D1 and the second driving signal D2. A cycle of switching the output of the first driving signal D1 and the second driving signal D2, for example, is set in advance in the driving device 30. By switching the output of the first driving signal D1 and the second driving signal D2, it is possible to approximately equally share a stress due to the voltage applied to the first gate electrode G1 and the second gate electrode G2, and operate the switching element 20 while maintaining high reliability.

Switching the output of the first driving signal D1 and the second driving signal D2 may be performed by a signal supplied from the outside of the driving device 30, regardless of the setting in the driving device 30. In addition, switching the output of the first driving signal D1 and the second driving signal D2 may be performed at any timing, without limiting to a certain cycle. In addition, switching the output of the first driving signal D1 and the second driving signal D2 may be performed as described above, or may not be necessarily performed.

The configuration of the driving device 30 will be described. As shown in FIG. 1, the driving device 30 includes the control unit 40, a first driving unit 50, and a second driving unit 60. Favorably, the driving device 30 further includes a switching unit 70.

The control unit 40 is connected to the signal input terminal 11a. The control unit 40 is operated in accordance with the control signal Dg input to the signal input terminal 11a.

The control unit 40 includes an active driving table 44. In the active driving table 44, data for active driving is set. In the active driving table 44, for example, data of a target value of a time change of the voltage difference VCE between the collector and the emitter and a target value of a time change in the current IE flowing into the switching element 20 is set. The data of the target value of the voltage difference VCE and the current IE is set for each of the period where the switching element 20 is turned on and the period where the switching element is turned off.

The control unit 40 sequentially inputs the data of the voltage difference VCE and the data of the current IE. The control unit 40 compares the target value of the voltage difference VCE and the target value of the current IE in the active driving table 44 with the actually measured value. In a case where the actually measured value is less than the target value, the control unit 40 commands the first driving unit 50 and the second driving unit 60 to decrease the output impedance. In a case where the actually measured value is greater than the target value, the control unit 40 commands the first driving unit 50 and the second driving unit 60 to increase the output impedance.

More specifically, the control unit 40 determines whether it is the period where the switching element 20 is turned on or the period where the switching element is turned off, on the basis of the control signal Dg. In a case where it is determined that it is the period where the switching element 20 is turned on, the control unit 40 compares the target value for the period where the switching element is turned on with the actually measured value from the active driving table 44, and outputs a command relevant to the control of the output impedance to the first driving unit 50. In a case where it is determined that it is the period where the switching element 20 is turned off, the control unit 40 compares the target value for the period where the switching element is turned off with the actually measured value from the active driving table 44, and outputs the command relevant to the control of the output impedance to the second driving unit 60.

The first driving unit 50 includes a first active driving control unit 52 and an ON timing control unit 54. The first active driving control unit 52 and the ON timing control unit 54 are connected to the control unit 40. The first active driving control unit 52 inputs set data of the output impedance in the period where the switching element is turned on from the control unit 40 to set the output impedance. The first active driving control unit 52 outputs the driving signal D1, for example, to the output terminal O1 with the set output impedance.

The second driving unit 60 includes a second active driving control unit 62 and an OFF timing control unit 64. The second active driving control unit 62 and the OFF timing control unit 64 are connected to the control unit 40. The active driving control unit 62 inputs set data of the output impedance in the period where the switching element 20 is turned off to set the output impedance. The second active driving control unit 62 outputs the driving signal D1, for example, to the output terminal O1 with the set output impedance.

For example, the first active driving control unit 52 includes multiple resistance elements 52a and 52b on an output end. For example, the resistance element 52b is connected to a switch element 53 in series, and a series circuit of the resistance element 52b and the switch element 53 is connected to the resistance element 52a in parallel. In the first active driving control unit 52, by opening and closing the switch element 53, it is possible to switch the output impedance of the first active driving control unit 52. For example, in a case where the switch element 53 is opened, the output impedance of the first active driving control unit 52 is determined by the resistance value of the resistance element 52a. For example, in a case where the switch element 53 is closed, the output impedance of the first active driving control unit 52 is determined by the resistance value when the resistance elements 52a and 52b are connected in parallel.

The second active driving control unit 62 includes multiple resistance elements 62a and 62b on an output end. For example, the resistance element 62b is connected to a switch element 63 in series, and a series circuit of the resistance element 62b and the switch element 63 is connected to the resistance element 62a in parallel. In the second active driving control unit 62, by opening and closing the switch element 63, it is possible to switch the output impedance of the second active driving control unit 62. For example, in a case where the switch element 63 is opened, the output impedance of the second active driving control unit 62 is determined by the resistance value of the resistance element 62a. For example, in a case where the switch element 63 is closed, the output impedance of the second active driving control unit 62 is determined by the resistance value when the resistance elements 62a and 62b are connected in parallel.

In the first active driving control unit 52, a desired number of resistance elements are selected from the multiple resistance elements 52a and 52b, on the basis of the set data of the output impedance, and connected to have a desired combined resistance value. In the second active driving control unit 62, a predetermined number of resistance elements are selected from the multiple resistance elements 62a and 62b, on the basis of the set data of the output impedance, and connected to have a predetermined combined resistance value. Selecting indicates that a circuit having the value described above or a predetermined circuit is turned off or switched.

In a case where the combined resistance value due to the connection of the multiple resistance elements 52a and 52b is large, the output impedance of the first active driving control unit 52 is large, and in a case where the combined resistance value due to the connection of the multiple resistance elements 52a and 52b is small, the output impedance of the first active driving control unit 52 is small. Similarly, in a case where the combined resistance value due to the connection of the multiple resistance elements 62a and 62b is large, the output impedance of the second active driving control unit 62 is large, and in a case where the combined resistance value due to the connection of the multiple resistance elements 62a and 62b is small, the output impedance of the second active driving control unit 62 is small.

Each of the first active driving control unit 52 and the second active driving control unit 62 is not limited to the configuration described above, insofar as the output impedance can be variable. For example, multiple output buffer circuits that can be connected in parallel may be provided, and output buffer circuits with a number according to the setting value of the output impedance may be connected in parallel to make output current capability variable. Alternatively, the voltage of the power source supplied to the output buffer circuit may be switched in accordance with the set data of the output impedance.

The ON timing control unit 54 and the OFF timing control unit 64 output the second driving signal D2. A timing when the second driving signal D2 is the ON voltage VON, for example, is set in advance in the ON timing control unit 54. A timing when the second driving signal D2 is the OFF voltage VOFF, for example, is set in advance in the OFF timing control unit 64.

The switching unit 70 inputs the first driving signal D1 output from the first active driving control unit 52 and the second active driving control unit 62. The switching unit 70 inputs the second driving signal D2 output from the OFF timing control unit 64. The switching unit 70 switches the first driving signal D1 and the second driving signal D2, and outputs the first driving signal and the second driving signal from the output terminals O1 and O2.

In this specific example, a timing of switching the first driving signal D1 and the second driving signal D2 is set in accordance with a selection signal SG output from a gate selection unit 42 provided in the control unit 40. The switching unit 70, for example, switches and outputs the first driving signal D1 and the second driving signal D2 each time when the selection signal SG that is a binary signal is inversed.

In this specific example, the switching unit 70 includes two switching circuits 72 and 74. One switching circuit 72 includes switches 72a and 72b. The switches 72a and 72b are configured such that one turns off the circuit, and the other turns on the circuit. Switches 74a and 74b are configured such that one turns off the circuit, and the other turns on the circuit.

In a case where the selection signal SG is at an H level, the switch 72a and the switch 74a turn off the circuit, and the switch 72b and the switch 74b turn on the circuit. Accordingly, the switching unit 70 outputs the first driving signal D1 to the first gate electrode G1 through the output terminal O1, and outputs the second driving signal D2 to the second gate electrode G2 through the output terminal O2.

In a case where the selection signal SG is at an L level, the switch 72a and the switch 74a turn on the circuit, and the switch 72b and the switch 74b turn off the circuit. Accordingly, the switching unit 70 outputs the second driving signal D2 to the first gate electrode G1 through the output terminal O1, and outputs the first driving signal D1 to the second gate electrode G2 through the output terminal O2.

The operation of the driving device 30 of the power module 10 according to the embodiment will be described.

Figure 2:
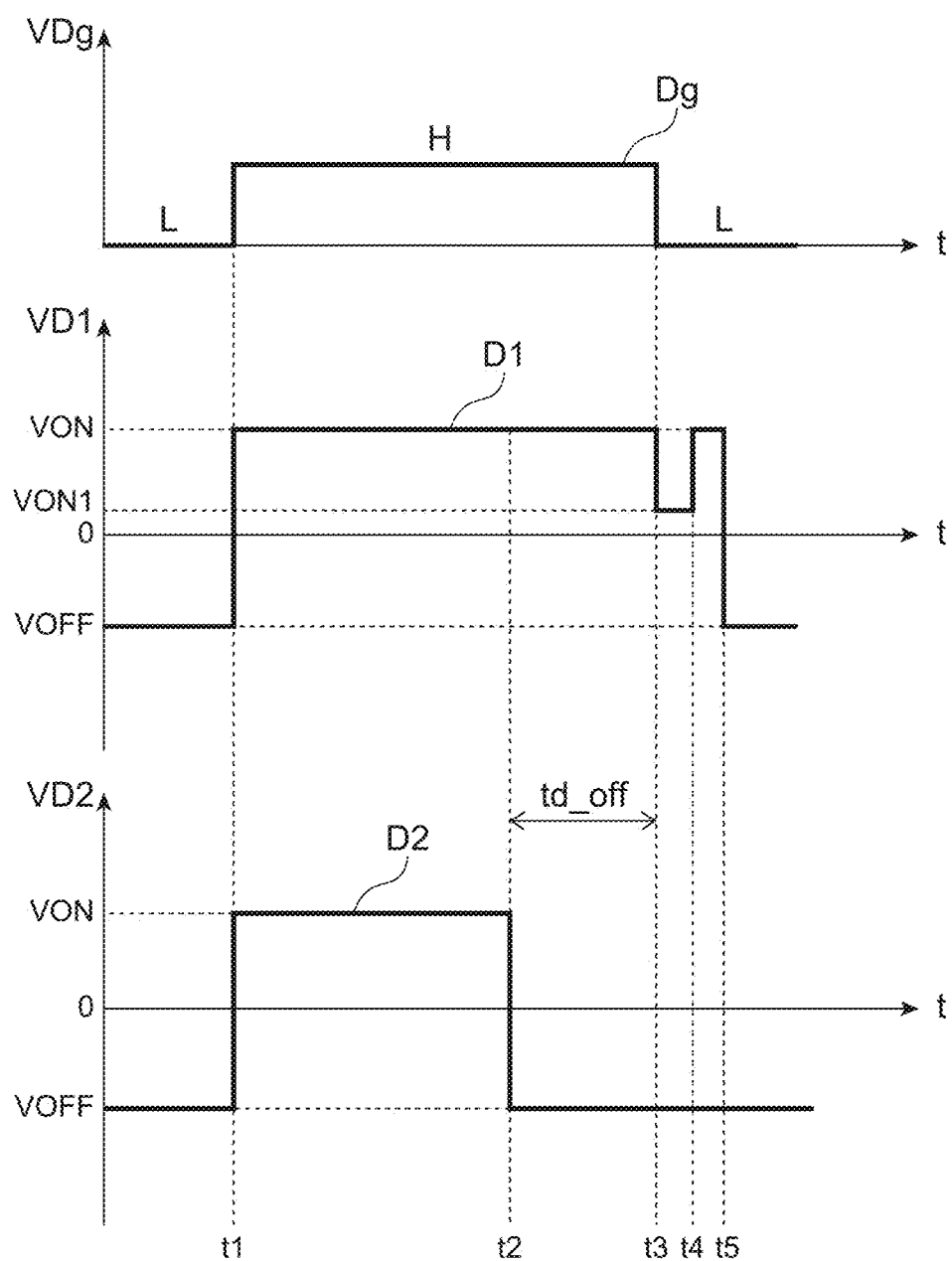
FIG. 2 is a schematic timing chart for describing an operation of a driving device of the power module according to the first embodiment.

FIG. 2 is a schematic timing chart for describing the operation of the driving device of the power module according to the first embodiment.

The top drawing in FIG. 2 shows a time change of the control signal Dg input to the driving device 30. A period where a voltage VDg of the control signal Dg is at an H level is a period where the switching element 20 is turned on. A period where the voltage VDg of the control signal Dg is at an L level is a period where the switching element 20 is turned off.

The second drawing in FIG. 2 shows a time change of a voltage VD1 of the first driving signal D1. The voltage VD1 of the first driving signal is applied between the first gate electrode G1 and the emitter electrode E1.

The bottom drawing in FIG. 2 shows a time change of the second driving signal D2. A voltage VD2 of the second driving signal D2 is applied between the second gate electrode G2 and the emitter electrode E1.

In the description of FIG. 2, it is assumed that in FIG. 1, the switches 72a and 74a turn off the circuit, and the switches 72b and 74b turn on the circuit. That is, it will be described that the driving device 30 outputs the first driving signal D1 to the first gate electrode G1 through the output terminal O1, and outputs the second driving signal D2 to the second gate electrode G2 through the output terminal O2.

As shown in FIG. 2, in a period before a time t1, the control signal Dg is at an L level. In the period where the control signal Dg is at an L level, the second active driving control unit 62 outputs the first driving signal D1 of the OFF voltage VOFF, and the OFF timing control unit 64 outputs the second driving signal D2 of the OFF voltage VOFF.

At the time t1, the control signal Dg is transitioned to an H level from an L level. The first active driving control unit 52 starts the active control of the first driving signal D1 for turning on, in accordance with the transition of the control signal Dg.

The control unit 40 generates a command of controlling the output impedance in a turn-on period from the active driving table 44 such that the actually measured value follows the target value of the time change of the voltage difference VCE and the time change of the current IE, and outputs the command to the first active driving control unit 52. The command of controlling the output impedance decreases the output impedance in a case where the actually measured value is less than the target value, and increases the output impedance in a case where the actually measured value is greater than the target value. The first active driving control unit 52 sets the output impedance, in accordance with the command, and drives the first gate electrode G1 of the switching element 20 with the set output impedance. Note that, in a case where the target value is coincident with the actually measured value, the control unit 40 may output a command of maintaining the output impedance at that time, and when the command is not output, the first active driving control unit 52 may maintain the output impedance at that time. In the example of FIG. 2, the voltage VD1 of the first driving signal D1 at this time is the ON voltage VON.

At the time t1, the ON timing control unit 54 increases the voltage VD2 of the second driving signal D2 to the ON voltage VON, in accordance with the transition of the control signal Dg. In this example, a timing when the voltage VD2 of the second driving signal D2 is increased to the ON voltage VON is coincident with a rise timing of the control signal Dg and the first driving signal D1, and the delay time is 0.

At a time t2, the OFF timing control unit 64 decreases the second driving signal D2 to the OFF voltage VOFF. The time t2 is earlier than a time t3 when the control signal Dg is transitioned to an L level from an H level by an OFF delay time td_off. The OFF delay time td_off is set in advance in the OFF timing control unit 64. As a predetermined setting value of the OFF delay time td_off, for example, a suitable value is set on the basis of the turn-off rate to be attained by the switching element 20.

At the time t3, the control signal Dg is transitioned to an L level from an H level. The second active driving control unit 62 starts the active control of the first driving signal D1 for turning off. The control unit 40 generates a command of controlling the output impedance in a turn-off period in the active driving table 44 such that the actually measured value follows the acquired target value of the time change of the voltage difference VCE and the time change of the current IE, and outputs the command to the second active driving control unit 62. As with the case of turning on, the command of controlling the output impedance decreases the output impedance in a case where the actually measured value is less than the target value, and increases the output impedance in a case where the actually measured value is greater than the target value. The second active driving control unit 62 drives the second gate electrode G2 of the switching element 20 with the set output impedance. Note that, as with the case of turning on, in a case where the target value is coincident with the actually measured value, the control unit 40 may output a command of maintaining the output impedance at that time, or the second active driving control unit 62 may maintain the output impedance at that time without outputting the command.

In the example of FIG. 2, in a period from the time t3 to a time t4, the time change of VCE and the time change of IE is slower than the target value, and thus, the driving device 30 decreases the output impedance, and outputs the first driving signal D1. The voltage value of the first driving signal D1 is transitioned to VON1 lower than the ON voltage VON.

In a period from the time t4 to a time t5, the switching rate of the switching element 20 is faster than the target value, and thus, the driving device 30 increases the output impedance, and outputs the first driving signal D2. The voltage value of the first driving signal D1 is increased to the ON voltage VON.

As described above, the waveform of VCE and IE when switching the switching element 20 is controlled to follow the target value by the output impedance for driving the first gate electrode G1. Accordingly, the driving device 30 is capable of operating the switching element 20 at a suitable switching rate.

In the driving device 30 according to the embodiment, by driving the switching element 20 in accordance with the active driving as described above, it is possible to suppress the occurrence of the surge voltage and the occurrence of the noise due to the acceleration of the switching rate while reducing the switching loss.

In the above description, the output impedance of each of the first active driving control unit 52 and the second active driving control unit 62 is set for each set of the voltage difference VCE and the current IE output from the switching element 20, but is not limited thereto. The output impedance of each of the first active driving control unit 52 and the second active driving control unit 62 may be set on the basis of the value of either the time change of the voltage difference VCE or the time change of the current IE.

In addition, the output impedance of each of the first active driving control unit 52 and the second active driving control unit 62 is not limited to the waveform of the output of the switching element 20, and may be set in accordance with other parameters. For example, the output impedance of each of the first active driving control unit 52 and the second active driving control unit 62 may be set in accordance with the value of a direct-current voltage input to a power conversion circuit 100 described below in association with FIG. 4. For example, in the case of a load, an input voltage, or the like with less fluctuation, the output impedance may be set to be in a driving condition set in advance in accordance with the characteristic of the switching element 20.

The configuration and the double gate driving of the switching element 20 will be described.

Figure 3:
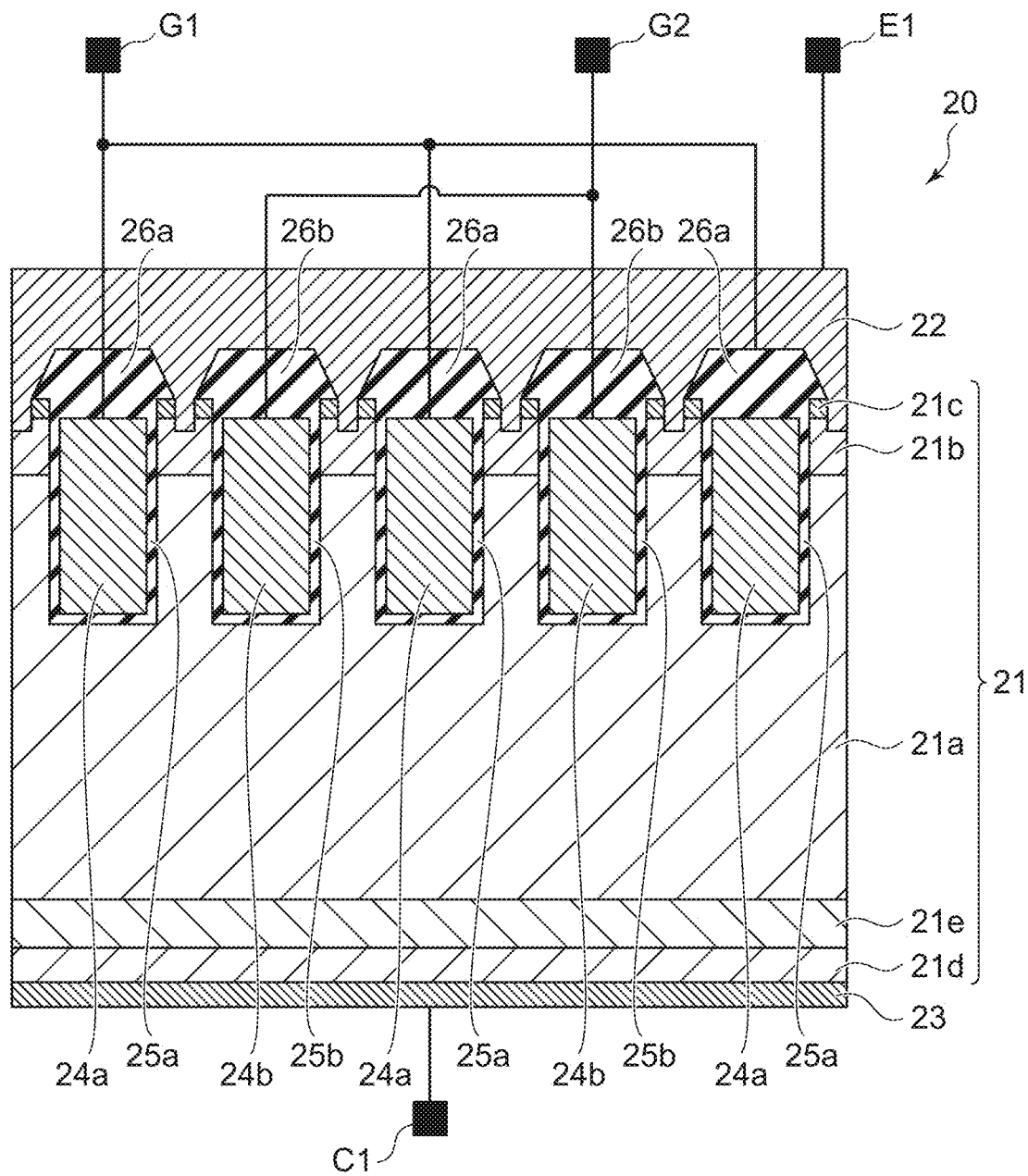
FIG. 3 is a schematic sectional view illustrating a switching element that is a part of the power module according to the first embodiment.

FIG. 3 is a schematic sectional view illustrating the switching element that is a part of the power module according to the first embodiment.

As shown in FIG. 3, the switching element 20 includes two control electrodes. Specifically, the switching element 20 includes a semiconductor portion 21, a first electrode 22, a second electrode 23, a first control electrode 24*a*, and a second control electrode 24*b*. The first electrode 22 is electrically connected to the emitter electrode E1. The second electrode 23 is electrically connected to the collector electrode C1. The first control electrode 24*a* and the second control electrode 24*b* are electrically connected to the first gate electrode G1 and the second gate electrode G2.

The semiconductor portion 21 is provided between the first electrode 22 and the second electrode 23. The semiconductor portion 21, for example, is silicon. The first electrode 22 and the second electrode 23, for example, are a metal layer containing aluminum, titanium, or the like.

The first control electrode 24*a* and the second control electrode 24*b* are provided between the semiconductor portion 21 and the first electrode 22, and electrically separated from each other. Each of the first control electrode 24*a* and the second control electrode 24*b* is disposed inside a trench provided in the semiconductor portion 21, and extends into the semiconductor portion 21.

The first control electrode 24*a* is electrically separated from the semiconductor portion 21 by a first insulating film 25*a*. The second control electrode 24*b* is electrically separated from the semiconductor portion 21 by a second insulating film 25*b*. The first control electrode 24*a* and the second control electrode 24*b* are electrically separated from the first electrode 22 by interlayer insulating films 26*a* and 26*b*.

The semiconductor portion 21 includes a first layer (a first semiconductor portion) 21*a* of a first conductivity type, a second layer (a second semiconductor portion) 21*b* of a second conductivity type, a third layer (a third semiconductor portion) 21*c* of a first conductivity type, and a fourth layer (a fourth semiconductor portion) 21*d* of a second conductivity type. Hereinafter, the first conductivity type will be described as an n-type, and the second conductivity type will be described as a p-type.

The first control electrode 24*a* and the second control electrode 24*b* extend into the first layer 21*a* from the surface side of the semiconductor portion 21. The first layer 21*a*, for example, is an n-type base layer.

The second layer 21*b* is provided between the first layer 21*b* and the first electrode 22. The second layer 21*b* includes a portion facing the first control electrode 24*a* through the first insulating film 25*a*. The second layer 21*b* includes a portion facing the second control electrode 24*b* through the second insulating film 25*b*. The second layer 21*b*, for example, is a p-type base layer. Each of the first insulating film 25*a* and the second insulating film 25*b* functions as a gate insulating film.

The third layer 21*c* is selectively provided between the second layer 21*b* and the first electrode 22, and electrically connected to the first electrode 22. The third layer 21*c*, for example, is an n-type emitter layer. Multiple third layers 21c are provided, and disposed at a position in contact with the first insulating film 25a and the second insulating film 25b.

The fourth layer 21d is provided between the first layer 21a and the second electrode 23, and electrically connected to the second electrode 23. The fourth layer 21d, for example, is a p-type collector layer.

The semiconductor portion 21 further includes a fifth layer 21e of a first conductivity type.

The fifth layer 21e is provided between the first layer 21a and the fourth layer 21d. The fifth layer 21e, for example, is an n-type buffer layer, and has a first conductivity type impurity with a concentration higher than the first conductivity type impurity concentration of the first layer 21a.

Note that, in the fourth layer 21d, a p-type collector layer of a second conductivity type and an n-type cathode layer of a first conductivity type may be alternately disposed between the fifth layer 21e and the second electrode 23. In the fourth layer 21d, the switching element functions as IGBT in a region in which the p-type collector layer is disposed. In the fourth layer 21d, the switching element functions as a diode which allows the first electrode 22 to function as an anode electrode and the second electrode 23 to function as a cathode electrode, in a region in which the n-type cathode layer is disposed. In this case, the switching element is a reverse conducting IGBT (RC-IGBT).

In the turn-on period of the switching element 20, the first control electrode 24a and the second control electrode 24b are operated in synchronization. That is, in the turn-on period, for the first electrode 22, a voltage sufficiently higher than the threshold value is simultaneously applied to the first control electrode 24a and the second control electrode 24b. Accordingly, in the second layer 21b, an inversion layer is formed in a portion facing each of the first insulating film 25a and the second insulating film 25b, and the channel of the majority carrier is formed. In the example of FIG. 3, the majority carrier is an electron. The electron flows through the first layer 21a and is injected to the fourth layer 21d. The fourth layer 21d injects a hole to the first layer 21a. Accordingly, conductivity modulation occurs, and a voltage drop between the second layer 21b, the first layer 21a, and the fourth layer 21d decreases, and the switching element 20 is electrically connected in a low-voltage state, and thus, a conduction loss is reduced.

In the turn-off period of the switching element 20, voltage sufficiently lower than the threshold value is applied to the second control electrode 24b before the first control electrode 24a. Accordingly, in the second layer 21b, a storage layer is formed in the portion facing the first insulating film 25b, and thus, the minority carrier remaining in the adjacent first layer 21a of the first conductivity type can be sucked out through the storage layer. The minority carrier, for example, is a hole. As a result thereof, the density of the holes remaining in the layer of the first conductivity type is reduced, and a transistor formed in the fourth layer 21d, the first layer 21a, and the third layer 21c is promptly turned off. As described above, the turn-off of the switching element 20 is accelerated by the double gate driving.

For example, the first control electrode 24a and the second control electrode 24b are disposed alternately adjacent to each other in the semiconductor portion 21. The portion of the transistor controlled by the first control electrode 24a and the portion of the transistor controlled by the second control electrode 24b are approximately equivalent. That is, even in a case where the first control electrode 24a and the second control electrode are switched and operated as described above, the switching element 20 performs the same operation.

As described above, in the switching element 20, even in a case where the driving signal D1 and the driving signal D2 are input by switching the first gate electrode G1 corresponding to the first control electrode 24a and the second gate electrode G2 corresponding to the second control electrode 24b, the same operation is performed.

A specific example of driving the switching element 20 by periodically switching the first driving signal D1 and the second driving signal D2 in the driving device 30 will be described.

Figure 4:
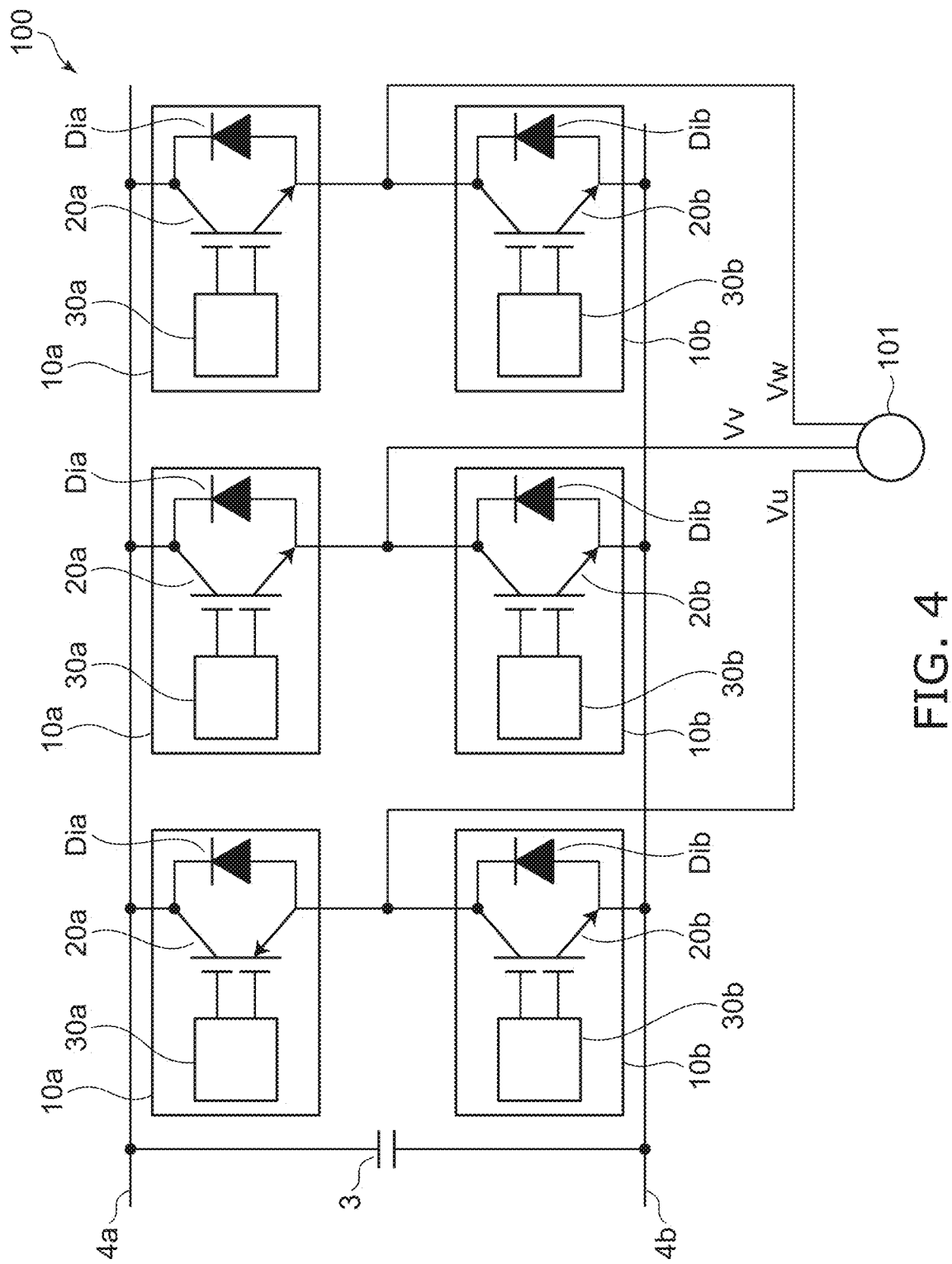
FIG. 4 is a schematic block diagram of a power conversion circuit.

FIG. 4 is a schematic block diagram of the power conversion circuit.

Figure 5:
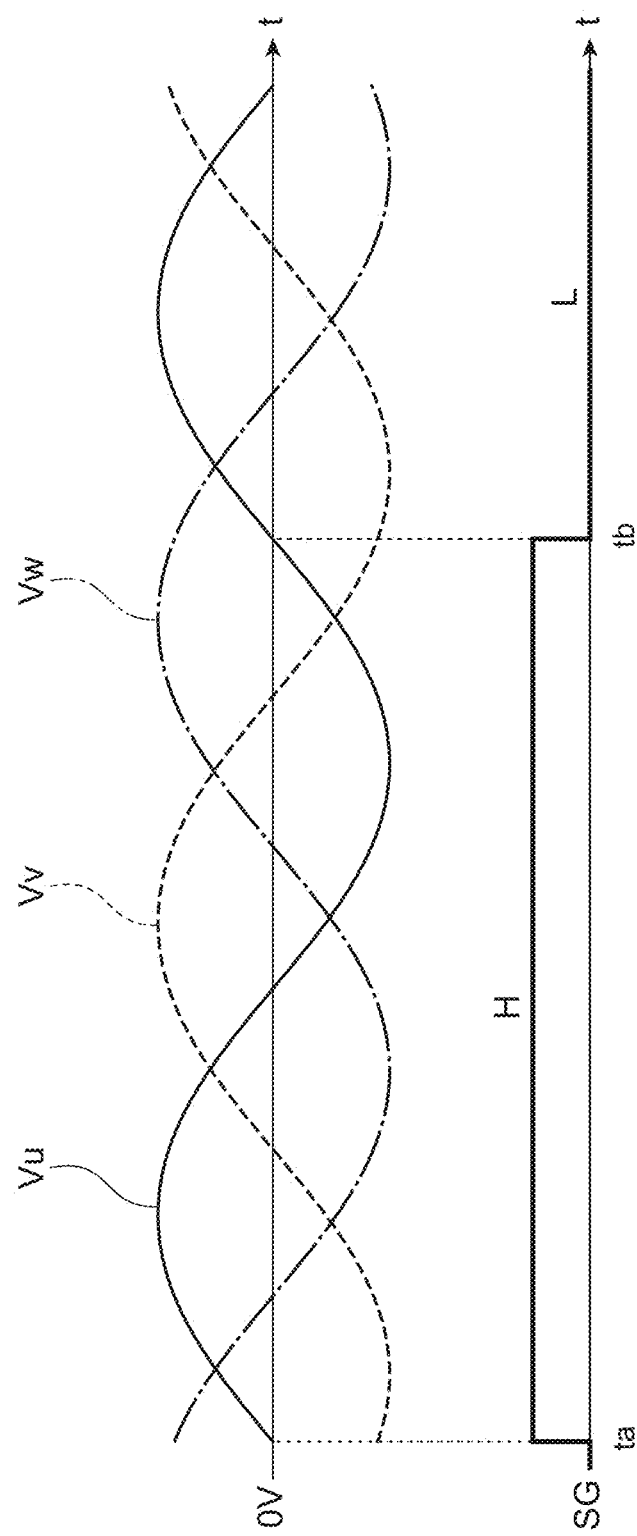
FIG. 5 is an example of a schematic operation waveform chart illustrating an operation of the power conversion circuit in FIG. 4.

FIG. 5 is an example of a schematic operation waveform chart illustrating the operation of the power conversion circuit in FIG. 4.

As shown in FIG. 4, the power conversion circuit 100 includes power modules 10a and 10b. The power modules 10a and 10b include switching elements 20a and 20b, and driving devices 30a and 30b, respectively. The power modules 10a and 10b are different from the power module 10 shown in FIG. 1 in that the power modules include diodes Dia and Dib, respectively, but have the same configuration as that of the power module 10 in other respects. The diodes Dia and Dib function as a free wheeling diode in the power conversion circuit. The switching elements 20a and 20b and the driving devices 30a and 30b are assigned with different signs to be distinguished from each other, but have the same configuration as that of the switching element 20 and the driving device 30 described in FIG. 1 to FIG. 3.

The switching elements 20a and 20b are connected to the diodes Dia and Dib in inverse parallel, respectively. The switching elements 20a and 20b are connected in series. A series circuit of the switching elements 20a and 20b is connected between direct-current power source lines 4a and 4b. The voltage value of the direct-current power source line 4a is higher than the voltage value of the direct-current power source line 4b.

The driving device 30a, for example, is connected to the switching element 20a to drive the switching element 20a in the timing chart shown in FIG. 2. The driving device 30b, for example, is connected to the switching element 20b to drive the switching element 20b in the timing chart shown in FIG. 2.

A complementary control signal is input to the driving devices 30a and 30b. The driving devices 30a and 30b complementarily drive the switching elements 20a and 20b. That is, in a case where the driving device 30a turns on the switching element 20a, the driving device 30b turns off the switching element 20b. In a case where the driving device 30a turns off the switching element 20a, the driving device 30b turns on the switching element 20b. The driving devices 30a and 30b drive the switching elements 20a and 20b, respectively, such that the switching elements 20a and 20b are not simultaneously turned on.

In the power conversion circuit 100, three sets of half-bridge circuits composed of the driving devices 30a and 30b, the switching elements 20a and 20b, and the diodes Dia and Dib are provided. Three sets of half-bridge circuits are connected between the direct-current power source lines 4a and 4b. A capacitor 3 is connected between the direct-current power source lines 4a and 4b, and three half-bridge circuits are connected to the capacitor 3 in parallel.

In the half-bridge circuit, a connection node of a series circuit of the switching elements 20a and 20b is connected to a three-phase alternating load 101. The power conversion circuit 100 outputs three-phase alternating voltages Vu, Vv, and Vw to the three-phase alternating load 101. The power conversion circuit 100 converts a direct-current voltage to an alternating voltage. In addition, the power conversion circuit 100 is capable of converting the alternating voltage to the direct-current voltage by using the three-phase alternating load as the three-phase alternating power source.

The upper drawing in FIG. 5 shows a time change of the three-phase alternating voltages Vu, Vv, and Vw output from the power conversion circuit 100.

The lower drawing in FIG. 5 shows a time change of the selection signal SG of the driving devices 30a and 30b. In the three-phase alternating voltages Vu, Vv, and Vw, one three-phase alternating voltage Vu is set as a reference voltage waveform. As shown in FIG. 5, the selection signal SG is generated in synchronization with the phase of the three-phase alternating voltage Vu. For example, the selection signal SG is transitioned to an H level at a time ta when the three-phase alternating voltage Vu is 0 V. The selection signal SG is transitioned to an L level at a time tb after one cycle from the time ta, at the three-phase alternating voltage Vu.

As described in association with FIG. 1, the switching unit 70 switches and supplies the driving signals D1 and D2 to the first gate electrode G1 and the second gate electrode G2, in accordance with the selection signal SG. Accordingly, a period of applying the voltage of the first gate electrode G1 and the second gate electrode G2 by the voltage of the driving signals D1 and D2 can be approximately equal.

The effect of the driving device 30 and the power module 10 according to the embodiment will be described.

In the power module 10 according to the embodiment, the driving device 30 is capable of turning off the switching element 20 at a high speed by the double gate driving of the switching element 20. In the power module 10 according to the embodiment, the driving device 30 drives the switching element 20 by the active driving in addition to the double gate driving, and thus, it is possible to attain a high-speed switching operation, compared to a case where the double gate driving is performed alone.

In the active driving of the driving device 30, the switching rate of the switching element 20 can be adjusted in addition to the high-speed driving of the switching element 20, and thus, it is possible to drive the switching element in a suitable condition, in accordance with the characteristic of the switching element 20. In a case where the driving condition of the active driving is optimally set, it is possible to make a low switching loss and the high-speed switching compatible by the high-speed switching while suppressing dv/dt or di/dt of the switching element 20. In addition, it is also possible to suppress dv/dt or di/dt by the driving condition of the active driving, and it is also possible to suppress the occurrence of the noise while maintaining a low switching loss.

The driving device 30 or the power module 10 can be used in the power conversion circuit 100 having a bridge configuration shown in FIG. 4. In the driving device 30 and the power module 10 according to the embodiment, by applying both of the active driving and the double gate driving, it is possible to reduce a turn-off time of the switching element 20. Accordingly, in the bridge configuration, it is possible to reduce a dead time provided to prevent the upper and lower switching elements from being simultaneously turned on. In the power conversion circuit of the bridge configuration, by reducing the dead time, a period where a current flows into the diode is reduced, and a loss in the diode is suppressed, which may contribute to the improvement of the power conversion efficiency of the power conversion circuit. In addition, by reducing the dead time, it is possible to widen the conduction angle of the switching element 20, and further widen the control range of the power conversion circuit 100.

In the power module 10 according to the embodiment, the driving device 30 includes the switching unit 70. The switching unit 70 is capable of suitably switching the first driving signal D1 and the second driving signal D2, and outputting the signal to the switching element 20. As shown in FIG. 3, in the switching element 20, the portion of the transistor controlled by the first control electrode 24a and the portion of the transistor controlled by the second control electrode 24b are approximately equivalent. Accordingly, even in a case where the first driving signal D1 and the second driving signal D2 are switched and input to the first gate electrode G1 corresponding to the first control electrode 24a and the second gate electrode G2 corresponding to the second control electrode 24b, the switching element 20 performs the same operation.

As shown in FIG. 2, in the case of performing the double gate driving in the driving device 30, a period where a positive voltage is applied in accordance with the first driving signal D1 is different from a period where a positive voltage is applied in accordance with the second driving signal D2. In addition, a period in which a negative voltage is applied in accordance with the first driving signal D1 is different from a period in which a negative voltage is applied in accordance with the second driving signal D2.

In the case of applying the first driving signal D1 and the second driving signal D2 without switching the first gate electrode G1 and the second gate electrode G2, asymmetry occurs in a stress period for positive voltage application between the first insulating film 25a and the second insulating film 25b. In addition, asymmetry occurs in a stress period for negative voltage application between the first insulating film 25a and the second insulating film 25b. In a case where the stress period for the voltage application with respect to the insulating film becomes longer, degradation may be likely to progress.

In the embodiment, a timing of switching the output of the switching unit 70 can be suitably controlled such that the stress period for the voltage application is the same between the first insulating film 25a and the second insulating film 25b. Accordingly, it is possible to maintain the long-term reliability of the switching element 20.

Second Embodiment

Figure 6:
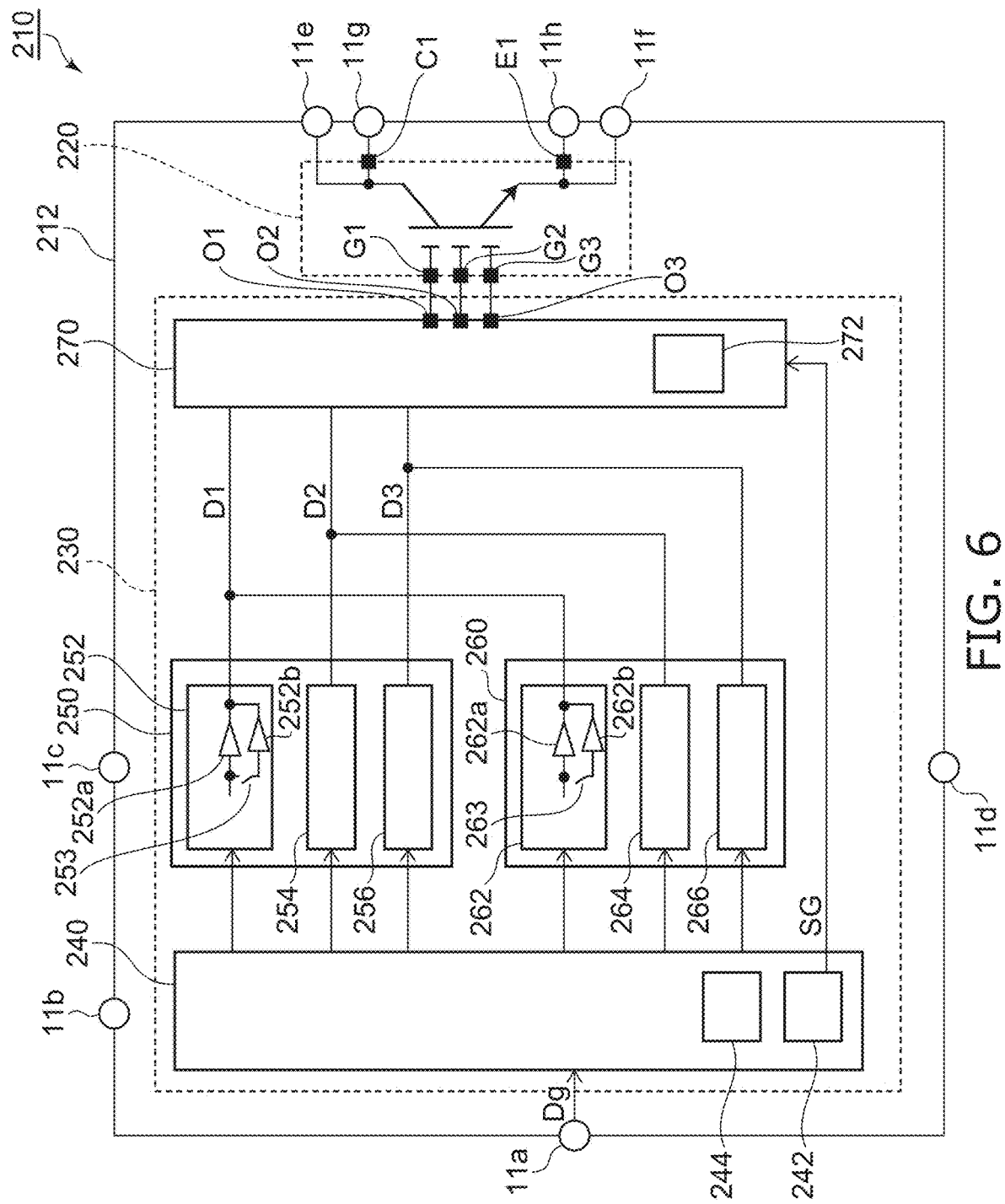
FIG. 6 is a schematic block diagram illustrating a power module according to a second embodiment.

FIG. 6 is a schematic block diagram illustrating a power module according to a second embodiment.

As shown in FIG. 6, a power module 210 according to the embodiment includes a switching element 220 and a driving device 230. The switching element 220 is different from the switching element 20 according to the first embodiment in that a third gate electrode G3 is provided. The driving device 230 drives the switching element 220 that is different from the switching element 20 according to the first embodiment, and thus, has a configuration different from that of the driving device 30 according to the first embodiment. The same reference numerals will be applied to the same constituents, and the detailed description will be suitably omitted.

In the power module 210 according to the embodiment, the driving device 230 includes output terminals O1, O2, and O3. The output terminal O1, the output terminal O2, and the output terminal O3 are connected to the first gate electrode G1, the second gate electrode G2, and the third gate electrode G3 of the switching element 220, respectively.

The driving device 230 includes a control unit 240, a first driving unit 250, a second driving unit 260, and a switching unit 270.

The control unit 240 is connected to the signal input terminal 11a. The control unit 240 is operated in accordance with the control signal Dg input from the signal input terminal 11a. The control unit 240 includes an active driving table 244. In the embodiment, in the active driving table 244, output impedance when the switching element is turned on and output impedance when the switching element is turned off are set in accordance with the amplitude of the control signal Dg. The amplitude of the control signal Dg, for example, is set in accordance with the direct-current voltage input to the power conversion circuit 100 shown in FIG. 4.

For example, in a case where the amplitude of the control signal Dg is a certain value or more, first output impedance is set, and in a case where the amplitude of the control signal Dg is narrower than the certain value, second output impedance is set. The control unit 240 determines the amplitude of the control signal Dg, determines the output impedance, and outputs the output impedance to the first driving unit 250 and the second driving unit 260.

The first driving unit 250 includes a first active driving control unit 252, a first ON timing control unit 254, and a second ON timing control unit 256. The second driving unit 260 includes a second active driving control unit 262, a first OFF timing control unit 264, and a second OFF timing control unit 266.

The first active driving control unit 252 includes multiple output buffer circuits 252a and 252b. The input of the output buffer circuit 252b is connected to the input of the output buffer circuit 252a through a switch element 253. The output of the output buffer circuit 252b is connected to the output of the output buffer circuit 252a. By opening and closing the switch element 253, the number of parallel connections of the output buffer circuits 252a and 252b is determined.

In a case where the number of parallel connections of the output buffer circuits 252a and 252b increases, the output impedance of the first active driving control unit 252 decreases. In a case where the number of parallel connections of the output buffer circuits 252a and 252b decreases, the output impedance of the first active driving control unit 252 increases.

The second active driving control unit 262 includes multiple output buffer circuits 262a and 262b. The input of the output buffer circuit 262b is connected to the input of the output buffer circuit 262a through a switch element 263. The output of the output buffer circuit 262b is connected to the output of the output buffer circuit 262a. By opening and closing the switch element 263, the number of parallel connections of the output buffer circuits 262a and 262b is determined.

In a case where the number of parallel connections of the output buffer circuits 262a and 262b increases, the output impedance of the second active driving control unit 262 decreases. In a case where the number of parallel connections of the output buffer circuits 262a and 262b decreases, the output impedance of the second active driving control unit 262 increases.

The first ON timing control unit 254 and the first OFF timing control unit 264 output the second driving signal D2 for driving the second gate electrode G2. The first ON timing control unit 254 sets a delay time from a rise timing of the control signal Dg to a rise timing of the second driving signal D2, and outputs the delay time to the second driving signal D2. The second ON timing control unit 256 sets a delay time from a fall timing of the second driving signal D2 to a fall timing of the control signal Dg. Such a delay time, for example, is set in advance.

The second ON timing control unit 256 and the second OFF timing control unit 266 output the third driving signal D3 for driving the third gate electrode G3. The second ON timing control unit 256 sets a delay time from a rise timing of the control signal Dg to a rise timing of the third driving signal D3. The second OFF timing control unit 266 sets a pulse width that is a time for maintaining the ON voltage VON after the third driving signal D3 rises. The delay time and the pulse width, for example, are set in advance. By the second ON timing control unit 256 and the second OFF timing control unit 266 driving the third gate electrode G3 of the switching element 220 into the shape of a pulse with the third driving signal D3, it is possible to accelerate a turn-on time of the switching element 220.

The switching unit 270 includes a switching table 272. The switching unit 270 inputs the output of the first active driving control unit 252, the output of the second active driving control unit 262, the output of the ON timing control unit 54, and the output of the OFF timing control unit 64, respectively. In accordance with the selection signal SG, the switching table 272 is applied, and the driving signals D1, D2, and D3 output from the switching table are sequentially switched and output from the output terminals O1, O2, and O3. The control unit 240 includes a gate selection unit 242. The gate selection unit 242 outputs the selection signal SG at a timing set in advance.

The operation of the driving device 230 of the power module 210 according to the embodiment will be described.

Figure 7:
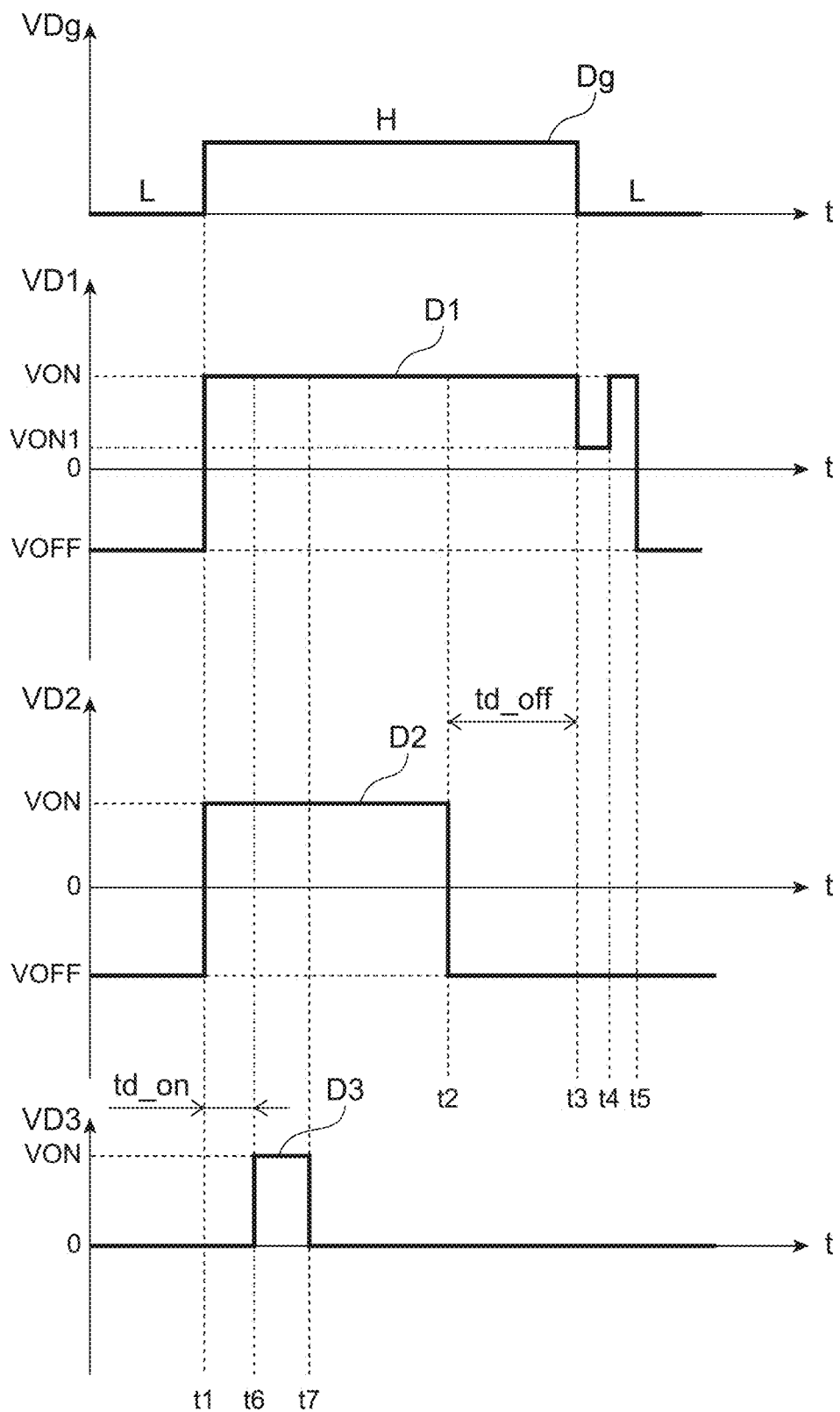
FIG. 7 is a schematic timing chart for describing an operation of a driving device according to the second embodiment.

FIG. 7 is a schematic timing chart for describing the operation of the driving device according to the second embodiment.

The top drawing, the second drawing, and the third drawing in FIG. 7 are the same as those in the first embodiment shown in FIG. 2.

The bottom drawing in FIG. 7 is a timing chart of the third driving signal D3 output from the driving device 230. The drawing of the third driving signal D3 is synchronized with the drawing of the first driving signal D1 and the second driving signal D2 on a time axis. A voltage VD3 of the third driving signal D3 is applied between the third gate electrode G3 and the emitter electrode E1.

As shown in FIG. 7, in a turn-on period of the switching element 220, at a time t1, the control signal Dg is transitioned from an L level to an H level. The control unit 240 detects the amplitude of the control signal Dg, and outputs the output impedance in the turn-on period according to the amplitude to the first active driving control unit 252.

As with the first embodiment shown in FIG. 2, the first active driving control unit 252 drives the first gate electrode G1 of the switching element 220 by the first driving signal D1 while performing the active control according to the control signal Dg. The first ON timing control unit 254 and the first OFF timing control unit 264 allow the second driving signal D2 to rise at the time t1 with the same phase as that of the control signal Dg and the first driving signal D1, and the second driving signal D2 to fall at a time t2 that is a timing earlier than a time t3 that is a timing when the control signal Dg is transitioned from an H level to an L level by td_off.

The second ON timing control unit 256 and the second OFF timing control unit 266 output the third driving signal to the third gate electrode G3 at a timing different from that of the control signal Dg, the first driving signal D1, and the second driving signal D2.

Before a time t6, the voltage VD3 of the third driving signal D3 is set to 0 V. At the time t6, the voltage VD3 of the third driving signal D3 is transitioned from 0 V to the ON voltage VON. A period between the time t1 and the time t6 is set in advance as an ON delay time td_on in the second ON timing control unit 256. As the predetermined value of the ON delay time td_on, for example, a suitable value is set on the basis of a turn-on speed to be attained by the switching element 220.

At a time t7, the voltage VD3 of the third driving signal D3 is transitioned from the ON voltage VON to 0 V. A period in which the voltage VD3 of the third driving signal D3 is the ON voltage VON between the time t6 and the time t7 is set in advance in the second OFF timing control unit 266.

As described above, by driving the third gate electrode G3 with a phase later than the first gate electrode G1, it is possible to reduce the turn-on time of the switching element 220. Accordingly, it is possible to reduce a switching loss of the switching element 220 in the turn-on period.

After the time t7, the voltage VD3 of the third driving signal D3 is maintained at 0 V.

The configuration of the switching element 220 will be described.

Figure 8:
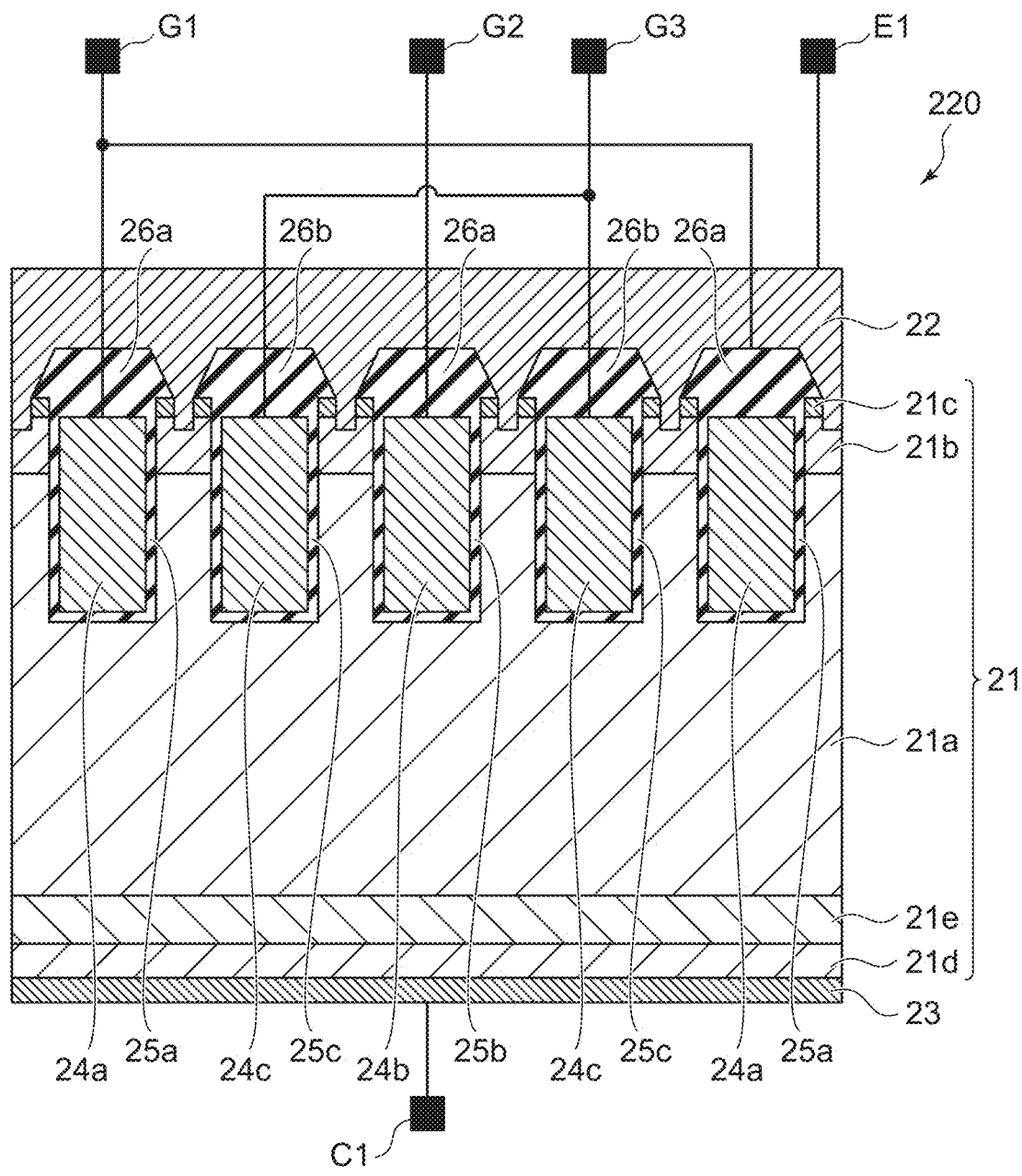
FIG. 8 is a schematic sectional view illustrating a switching element that is a part of the power module according to the second embodiment.

FIG. 8 is a schematic sectional view illustrating the switching element that is a part of the power module according to the second embodiment.

As shown in FIG. 8, the switching element 220 is different from the switching element 20 described above in association with FIG. 3 in that a third control electrode 24c is provided. The switching element 220 is the same as the switching element 20 in other respects.

As with the first control electrode 24a and the second control electrode 24b, the third control electrode 24c is provided between the semiconductor portion 21 and the first electrode 22. The third control electrode 24c is electrically separated from the first control electrode 24a and the second control electrode 24b. Each of the first control electrode 24a, the second control electrode 24b, and the third control electrode 24c is disposed inside the trench provided in the semiconductor portion 21, and extends into the semiconductor portion 21. The third control electrode 24c is electrically separated from the semiconductor portion 21 by a third insulating film 25c.

In the switching element 220, in the turn-on period, a voltage sufficiently higher than the threshold value is applied to the first control electrode 24a and the second control electrode 24b. Accordingly, in the second layer 21b, an inversion layer is formed in the portion facing the first insulating film 25a and the second insulating film 25b, and an electron from the third layer 21c is injected to the fourth layer 21d through the inversion layer of the second layer 21b and the first layer 21a. A hole is injected to the first layer 21a from the fourth layer 21d. Accordingly, the conductivity modulation occurs, and a low voltage drop is attained between the first electrode 22 and the second electrode 23.

In the switching element 220, the ON voltage VON sufficiently higher than the threshold value is applied to the third control electrode 24c later than the first control electrode 24a and the second control electrode 24b. In the second layer 21b, an inversion layer is formed in the portion facing the third control electrode 24c, and the injection of an electron to the first layer 21a is accelerated, and thus, it is possible to more promptly turn on the switching element.

The first control electrode 24a, the second control electrode 24b, and the third control electrode 24c, for example, are disposed adjacent to each other in the semiconductor portion 21. For example, the transistor controlled by the first control electrode 24a, the transistor controlled by the second control electrode 24b, and the transistor controlled by the third control electrode 24c are equivalent to each other. That is, even in the case of performing the operation as described above by sequentially switching the first control electrode 24a, the second control electrode 24b, and the third control electrode 24c, the same operation can be performed.

Figure 9:
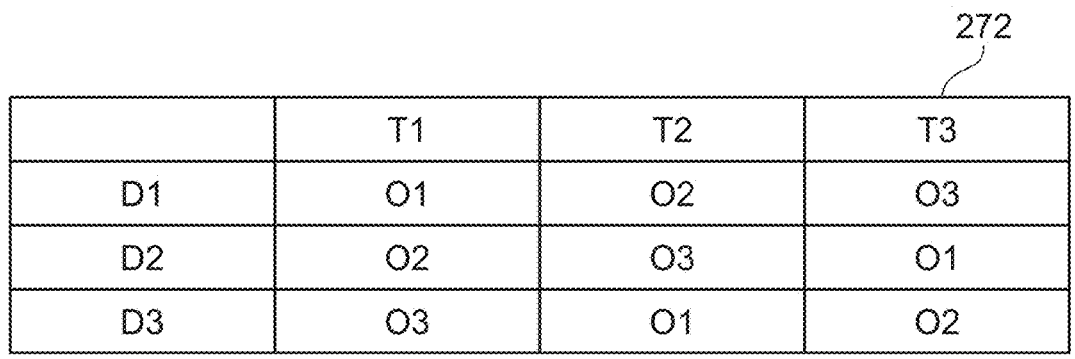
FIG. 9 is a table for describing a switching operation of a driving signal output from the driving device.

FIG. 9 is a table for describing the switching operation of the driving signal output from the driving device.

Figure 10:
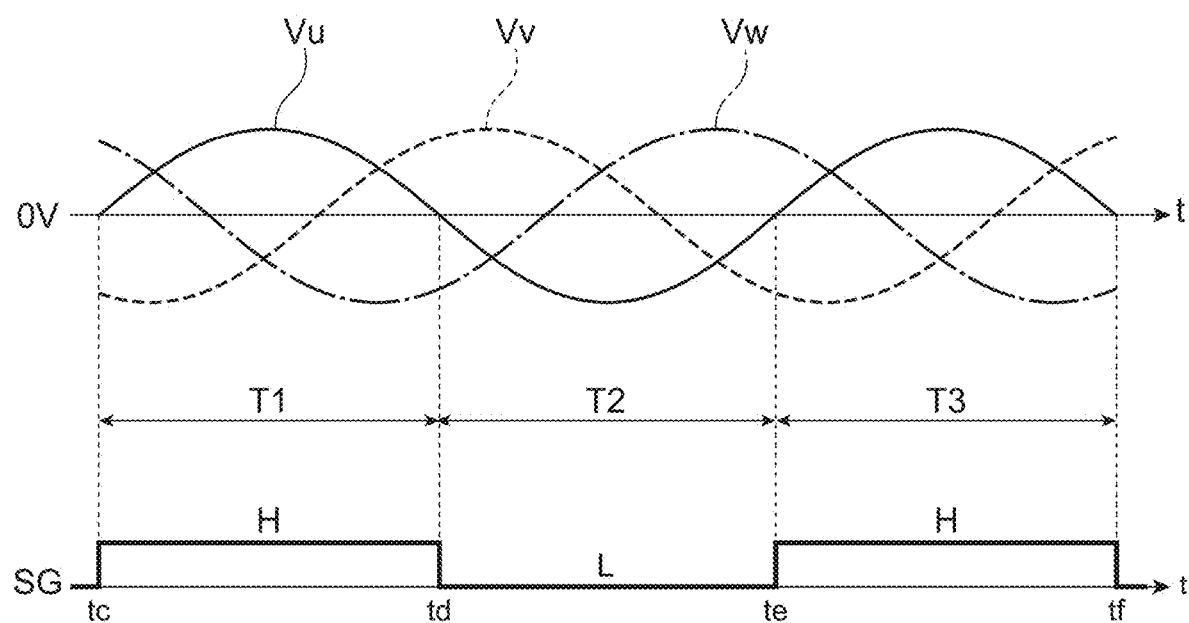
FIG. 10 is an example of a schematic operation waveform chart for describing an operation of the power module according to the second embodiment.

FIG. 10 is an example of a schematic operation waveform chart for describing the operation of the power module according to the second embodiment.

FIG. 9 shows the output terminals O1 to O3 from which the first driving signal D1, the second driving signal D2, and the third driving signal D3 are output in accordance with the selection signal SG output from the gate selection unit 242. FIG. 9 shows that connection between each of the driving signals D1 to D3 and the output terminals O1 to O3 is switched each time when periods T1, T2, and T3 proceed.

In FIG. 10, in the power conversion circuit 100 shown in FIG. 4, the three-phase alternating voltage Vu that is the voltage waveform of the three-phase alternating voltages Vu, Vv, and Vw output from the power conversion circuit in which the power module 10 is replaced with the power module 210 is set as a reference waveform.

As shown in FIG. 9 and FIG. 10, for example, the selection signal SG is inversed for each ½ cycle of the three-phase alternating voltage Vu, and the driving signals D1 to D3 output from the switching unit 270 are switched in accordance with the selection signal SG.

Specifically, in the period T1 from a time tc to a time td, the output terminal O1 outputs the driving signal D1, the output terminal O2 outputs the driving signal D2, and the output terminal O3 outputs the driving signal D3. In the period T2 from the time td to a time te, the output terminal O1 outputs the driving signal D2, the output terminal O2 outputs the driving signal D3, and the output terminal O3 outputs the driving signal. In the period T3 from the time te to a time tf, the output terminal O1 outputs the driving signal D3, the output terminal O2 outputs the driving signal D1, and the output terminal O3 outputs the driving signal D2. That is, the H level and the L level of the selection signal SG are inversed for each ½ cycle of the three-phase alternating voltage Vu.

In the switching element 220, the portion of the transistor controlled by the first control electrode 24a, the portion of the transistor controlled by the second control electrode 24b, and the portion of the transistor controlled by the third control electrode 24c are equivalent to each other. Accordingly, even in the case of switching the driving signals D1 to D3 for driving the first gate electrode G1 corresponding to the first control electrode 24a, the second gate electrode G2 corresponding to the second control electrode 24b, and the third gate electrode G3 corresponding to the third control electrode 24c, the switching element 220 performs the same operation.

The effect of the power module 210 according to the embodiment will be described.

The power module 210 according to the embodiment has the same effect as that of the power module 10 according to the first embodiment. In addition to the effect, the following effects are obtained. That is, the switching element 220 includes three gate electrodes, and the driving device 230 is capable of driving each of the gate electrodes. In the turn-on period of the switching element 220, the driving device 230 is capable of outputting the third driving signal D3 to the switching element 220 the ON delay time td_on later than the rise of the first driving signal D1. Accordingly, it is possible to reduce the turn-on time of the switching element 220, and further reduce the switching loss.

The driving device 230 includes the switching unit 270. The switching unit 270 is capable of switching and outputting the output of the driving signals D1 to D3 with different ON periods and OFF periods to three gate electrodes G1 to G3 of the switching element 220. Accordingly, it is possible to make the stress period of the voltage application approximately equal with respect to three gate electrodes of the switching element 220, equally suppress the degradation of the insulating films 25*a* to 25*c* of the switching element 220, and drive the switching element 220 with high reliability.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A driving device, comprising:
   a controller controlling a semiconductor element including a first gate electrode and a second gate electrode, on the basis of a control signal including information relevant to an ON timing and an OFF timing of the semiconductor element; and
   a driver generating a first driving signal for turning on the semiconductor element through the first gate electrode at the ON timing, and turning off the semiconductor element through the first gate electrode at the OFF timing, and a second driving signal for turning off the semiconductor element by pulling out a minority carrier of the semiconductor element through the second gate electrode at a timing earlier than the OFF timing,
   the driver being capable of switching between a first output impedance and a second output impedance when driving the first gate electrode, in accordance with a switching rate of the semiconductor element, switching to the first output impedance when the switching rate is faster than a predetermined value, and switching to the second output impedance lower than the first output impedance when the switching rate is slower than the predetermined value.

2. The driving device according to claim 1,
   wherein the driver switches a resistance value of a resistance element connected between the driver and the first gate electrode to switch to either the first output impedance or the second output impedance.

3. The driving device according to claim 2, further comprising
   a switching unit,
   during a first period set in advance,
   outputting the first driving signal to the first gate electrode, and
   outputting the second driving signal to the second gate electrode, and
   during a second period set in advance,
   outputting the first driving signal to the second gate electrode, and
   outputting the second driving signal to the first gate electrode.

4. The driving device according to claim 2,
   wherein the controller detects at least one of a voltage value between major electrodes of the semiconductor element and a current value flowing between the major electrodes to measure the switching rate, and switches to either the first output impedance or the second output impedance, on the basis of the measured switching rate.

5. The driving device according to claim 2,
   wherein the semiconductor element further includes a third gate electrode, and
   the driver generates a third driving signal for turning on the semiconductor element at a timing later than the ON timing and earlier than the OFF timing, and outputs the third driving signal to the third gate electrode.

6. The driving device according to claim 1,
   wherein the driver is capable of switching to a first driving circuit having first output current capability and to a second driving circuit having second output current capability greater than the first output current capability,
   switches to the second driving circuit when switching to the first output impedance, and
   switches to the first driving circuit when switching to the second output impedance.

7. The driving device according to claim 6, further comprising
   a switching unit,
   during a first period set in advance,
   outputting the first driving signal to the first gate electrode, and
   outputting the second driving signal to the second gate electrode, and
   during a second period set in advance,
   outputting the first driving signal to the second gate electrode, and
   outputting the second driving signal to the first gate electrode.

8. The driving device according to claim 6,
   wherein the controller detects at least one of a voltage value between major electrodes of the semiconductor element and a current value flowing between the major electrodes to measure the switching rate, and switches to either the first output impedance or the second output impedance, on the basis of the measured switching rate.

9. The driving device according to claim 6,
   wherein the semiconductor element further includes a third gate electrode, and
   the driver generates a third driving signal for turning on the semiconductor element at a timing later than the ON timing and earlier than the OFF timing, and outputs the third driving signal to the third gate electrode.

10. The driving device according to claim 1, further comprising
    a switching unit,
    during a first period set in advance,
    outputting the first driving signal to the first gate electrode, and
    outputting the second driving signal to the second gate electrode, and
    during a second period set in advance,
    outputting the first driving signal to the second gate electrode, and outputting the second driving signal to the first gate electrode.

11. The driving device according to claim 10, wherein the controller detects at least one of a voltage value between major electrodes of the semiconductor element and a current value flowing between the major electrodes to measure the switching rate, and switches to either the first output impedance or the second output impedance, on the basis of the measured switching rate.

12. The driving device according to claim 1, wherein the controller detects at least one of a voltage value between major electrodes of the semiconductor element and a current value flowing between the major electrodes to measure the switching rate, and switches to either the first output impedance or the second output impedance, on the basis of the measured switching rate.

13. The driving device according to claim 1, wherein the semiconductor element further includes a third gate electrode, and
the driver generates a third driving signal for turning on the semiconductor element at a timing later than the ON timing and earlier than the OFF timing, and outputs the third driving signal to the third gate electrode.

14. A semiconductor device, comprising:
the driving device according to claim 13;
the semiconductor element; and
a case for storing the semiconductor element and the driving device,
the semiconductor element including
a first electrode,
a second electrode,
a semiconductor portion provided between the first electrode and the second electrode,
a first control electrode provided from the semiconductor portion through a first insulating film, and electrically connected to the first gate electrode,
a second control electrode provided from the semiconductor portion through a second insulating film, electrically separated from the first control electrode, and electrically connected to the second gate electrode, and
a third control electrode provided from the semiconductor portion through a third insulating film, electrically separated from the first control electrode and the second control electrode, and electrically connected to the third gate electrode,
the semiconductor portion including
a first semiconductor portion of a first conductivity type,
a second semiconductor portion of a second conductivity type connected to the first electrode,
a third semiconductor portion of the first conductivity type connected to the first electrode, and provided between the first electrode and the second semiconductor portion, and
a fourth semiconductor portion of the second conductivity type connected to the second electrode, and provided between the first semiconductor portion and the second electrode,
the first control electrode facing the second semiconductor portion through the first insulating film,
the second control electrode facing the second semiconductor portion through the second insulating film, and
the third control electrode facing the second semiconductor portion through the third insulating film.

15. The semiconductor device according to claim 14, wherein the first control electrode and the second control electrode are provided to extend into the semiconductor portion.

16. The semiconductor device according to claim 14, wherein the first control electrode and the second control electrode are provided adjacent to each other.

17. The semiconductor device according to claim 14, wherein the semiconductor portion contains silicon.

18. The semiconductor device according to claim 14, wherein the first control electrode and the second control electrode contain one of aluminum and titanium.

19. A semiconductor device, comprising:
the driving device according to claim 1;
the semiconductor element; and
a case for storing the semiconductor element and the driving device,
the semiconductor element including
a first electrode,
a second electrode,
a semiconductor portion provided between the first electrode and the second electrode,
a first control electrode provided from the semiconductor portion through a first insulating film, and electrically connected to the first gate electrode, and
a second control electrode provided from the semiconductor portion through a second insulating film, electrically separated from the first control electrode, and electrically connected to the second gate electrode,
the semiconductor portion including
a first semiconductor portion of a first conductivity type,
a second semiconductor portion of a second conductivity type connected to the first electrode,
a third semiconductor portion of the first conductivity type connected to the first electrode, and provided between the first electrode and the second semiconductor portion, and
a fourth semiconductor portion of the second conductivity type connected to the second electrode, and provided between the first semiconductor portion and the second electrode,
the first control electrode facing the second semiconductor portion through the first insulating film, and
the second control electrode facing the second semiconductor portion through the second insulating film.

20. A driving device, comprising:
a controller controlling a semiconductor element including a first gate electrode and a second gate electrode, on the basis of a control signal including information relevant to an ON timing and an OFF timing of the semiconductor element; and
a driver generating a first driving signal for turning on the semiconductor element through the first gate electrode at the ON timing, and turning off the semiconductor element through the first gate electrode at the OFF timing, and a second driving signal for turning off the semiconductor element by pulling out a minority carrier of the semiconductor element through the second gate electrode at a timing earlier than the OFF timing,
the driver switching to a first output impedance when a switching rate of the semiconductor element is faster than a predetermined value, and switching to a second output impedance lower than the first output impedance when the switching rate is slower than the predetermined value.

* * * * *